(12) United States Patent
Schmidt et al.

(10) Patent No.: US 11,858,027 B2
(45) Date of Patent: Jan. 2, 2024

(54) AUXILIARY AIR VENT FOR CLIMATE CONTROL UNIT

(71) Applicant: Dantherm Cooling, Inc., Spartanburg, SC (US)

(72) Inventors: Charles Richard Schmidt, Spartanburg, SC (US); Troy F. Berg, Spartanburg, SC (US)

(73) Assignee: DANTHERM COOLING, INC., Spartanburg, SC (US)

( * ) Notice: Subject to any disclaimer, the term of this patent is extended or adjusted under 35 U.S.C. 154(b) by 0 days.

(21) Appl. No.: 18/110,964

(22) Filed: Feb. 17, 2023

(65) Prior Publication Data

US 2023/0264250 A1 Aug. 24, 2023

Related U.S. Application Data

(60) Provisional application No. 63/311,711, filed on Feb. 18, 2022.

(51) Int. Cl.
*B21D 53/06* (2006.01)
*H05K 7/20* (2006.01)

(52) U.S. Cl.
CPC ......... *B21D 53/06* (2013.01); *H05K 7/20172* (2013.01)

(58) Field of Classification Search
CPC .......... Y10T 29/4935; Y10T 29/49391; B21D 53/02; B21D 53/06; B21D 28/02; B21D 28/28; B21D 7/00; B21D 11/10; B21D 35/00; B21D 35/002

USPC ....................................... 29/890.03, 890.053
See application file for complete search history.

(56) References Cited

U.S. PATENT DOCUMENTS

| 4,974,436 | A | * | 12/1990 | Nakatsuji | B21D 28/28 83/636 |
| 5,231,862 | A | * | 8/1993 | Ashley | A47B 55/00 72/332 |
| 5,737,828 | A | * | 4/1998 | Barnes | B21D 53/027 29/726 |
| 7,021,110 | B2 | * | 4/2006 | Rosskamp | B21D 28/243 52/786.13 |
| 8,528,293 | B2 | * | 9/2013 | Sawyers | E06B 3/12 403/402 |
| 11,510,491 | B2 | * | 11/2022 | Thing | A47B 47/0058 |
| 2010/0033931 | A1 | * | 2/2010 | Miyazawa | H05K 7/20745 29/890.03 |
| 2021/0006046 | A1 | * | 1/2021 | Thing | A47B 96/1433 |

* cited by examiner

*Primary Examiner* — Sarang Afzali
*Assistant Examiner* — Darrell C Ford
(74) *Attorney, Agent, or Firm* — CASIMIR JONES, SC; Brian F. Bradley

(57) ABSTRACT

A climate control system including a heat exchanger assembly with a housing having an external air inlet, an external air outlet, an internal air inlet, and an internal air outlet. The system further includes an auxiliary air vent assembly coupled to the heat exchanger assembly. The auxiliary air vent assembly includes a rim at least partially defining an internal air inlet region and an internal air outlet region.

4 Claims, 9 Drawing Sheets

AUXILIARY AIR VENT FOR CLIMATE CONTROL UNIT

RELATED APPLICATIONS

This application claims priority to and the benefit of U.S. Provisional Patent Application No. 63/311,711 filed Feb. 18, 2022, which is incorporated herein by reference in its entirety for all purposes.

FIELD

The present disclosure provides systems, materials, devices, and methods related to cooling systems. In particular, the present disclosure provides an auxiliary air vent for a climate control unit for environments ranging from outdoor electronic enclosures to commercial and residential buildings.

BACKGROUND

Electronic enclosures generally include systems designed to house and protect sensitive and valuable computer and electronic equipment (e.g., equipment used by the Telecom, Industrial, Natural Resources Refining, Federal and Municipal Government or other industries), it is necessary for the internal area of the enclosure to be climate controlled (e.g., regulated temperature and humidity) and to be protected from the intrusion of dust and debris from the outside environment.

To control the environment of the electronic enclosure, a climate control unit (CCU) is used. A CCU is designed to reduce intrusion of outdoor contaminates like dust, water, salt etc. while also controlling the temperature of the equipment being protected. There are two main types of CCUs—Active and Passive cooling. Examples of active cooling CCUs include air conditioners, heat pumps, and water source geothermal HVAC systems. Examples of passive cooling CCUs include air to air heat exchangers, heat pipes, and thermosiphons.

SUMMARY

The Summary is provided to introduce a selection of concepts that are further described below in the Detailed Description. This Summary is not intended to identify key or essential features of the claimed subject matter, nor is it intended to be used as an aid in limiting the scope of the claimed subject matter.

One aspect of the present disclosure provides a climate control system including a heat exchanger assembly with a housing having an external air inlet, an external air outlet, an internal air inlet, and an internal air outlet. The climate control system further includes an auxiliary air vent assembly coupled to the heat exchanger assembly. The auxiliary air vent assembly includes a rim at least partially defining an internal air inlet region and an internal air outlet region.

In some embodiments, the rim includes an air passageway.

In some embodiments, a first aperture is formed in the rim and a second aperture formed in the rim. The first aperture is in fluid communication with the internal air inlet region, and the air passageway extends between the first aperture and the second aperture.

In some embodiments, the second aperture is in fluid communication with ambient atmosphere.

In some embodiments, the rim at least partially surrounds the internal air inlet and the internal air outlet of the housing.

In some embodiments, the internal air inlet of the heat exchanger assembly is in fluid communication with the internal air inlet region. The internal air outlet of the heat exchanger assembly is in fluid communication with the internal air outlet region.

In some embodiments, a divider is coupled to the rim. The divider is positioned between the internal air inlet region and the internal air outlet region.

In some embodiments, the rim includes a first mount surface, a second mount surface, an outer surface extending between the first mount surface and the second mount surface, and an inner surface extending between the first mount surface and the second mount surface. The rim further includes a first aperture formed on the inner surface and a second aperture formed in the outer surface.

In some embodiments, the rim further includes an air passageway that places the first aperture in and the second aperture in fluid communication.

In some embodiments, the heat exchanger assembly abuts the first mount surface.

In some embodiments, the system further includes a fan housing with a fan inlet, a fan outlet, and a fan positioned within the fan housing. The fan outlet is in fluid communication with the internal air outlet region.

In some embodiments, the fan inlet and the first mount surface are co-planar.

In some embodiments, the external air inlet is positioned between the external air outlet and the fan inlet.

In some embodiments, the rim is formed of square tubing.

In some embodiments, the heat exchanger assembly includes a passive heat exchanger.

In some embodiments, the heat exchanger assembly includes a first fan positioned at the internal air inlet configured to create an internal airflow through the housing from the internal air inlet to the internal air outlet; and a second fan positioned at the external air inlet configured to create an external airflow through the housing from the external air inlet to the external air outlet. The external airflow is isolated from the internal airflow by a dividing wall positioned within the housing.

In another aspect, the present disclosure provides a mount configured to couple a heat exchanger assembly to an enclosure. The mount includes a rim formed of square tubing with an internal passageway. The rim at least partially defining an air inlet region and an air outlet region. The mount further includes a first aperture formed in the rim and in fluid communication with the air inlet region, and a second aperture formed in the rim. The internal passageway extends between the first aperture and the second aperture.

In some embodiments, the mount further includes a fan housing coupled to the rim. The fan housing including a fan inlet and a fan outlet. The fan outlet is in fluid communication with the air outlet region.

In some embodiments, the mount further includes a damper positioned at the fan outlet.

In some embodiments, the rim includes a first mount surface and a second mount surface. The outer surface extends between the first mount surface and the second mount surface, and an inner surface extends between the first mount surface and the second mount surface. The fan inlet and the first mount surface are co-planar.

In some embodiments, the mount further includes a divider coupled to the rim and positioned between the air inlet region and air outlet region.

In some embodiments, the divider is positioned between the first aperture and the second aperture.

In some embodiments, the first aperture is formed on an inner surface of the rim, and the second aperture is formed on an outer surface of the rim.

In another aspect, the present disclosure provides a method of manufacturing a mount for a heat exchanger assembly. The method includes providing a square tube with an internal passageway, forming a first aperture in a first surface of the square tube, and forming a second aperture in a second surface of the square tube. The second surface is opposite the first surface. The method further includes forming a first relief and a second relief in the square tube, bending the square tube at the first relief to form a first corner, and bending the square tube at the second relief to form a second corner. The internal passageway places the first aperture and the second aperture in fluid communication.

In some embodiments, the square tube further includes a third surface and a fourth surface, and the first relief and the second relief are formed in the first surface, the third surface, and the fourth surface.

In some embodiments, in response to bending the square tube, the square tube is U-shaped and the first surface is an interior surface.

In some embodiments, the method further includes coupling a divider to the first surface of the square tube.

In some embodiments, the method further includes a fan module to the first surface of the square tube.

BRIEF DESCRIPTION OF THE DRAWINGS

The accompanying figures and examples are provided by way of illustration and not by way of limitation. The foregoing aspects and other features of the disclosure are explained in the following description, taken in connection with the accompanying example figures ("FIG.") relating to one or more embodiments.

DETAILED DESCRIPTION

Figure 1:
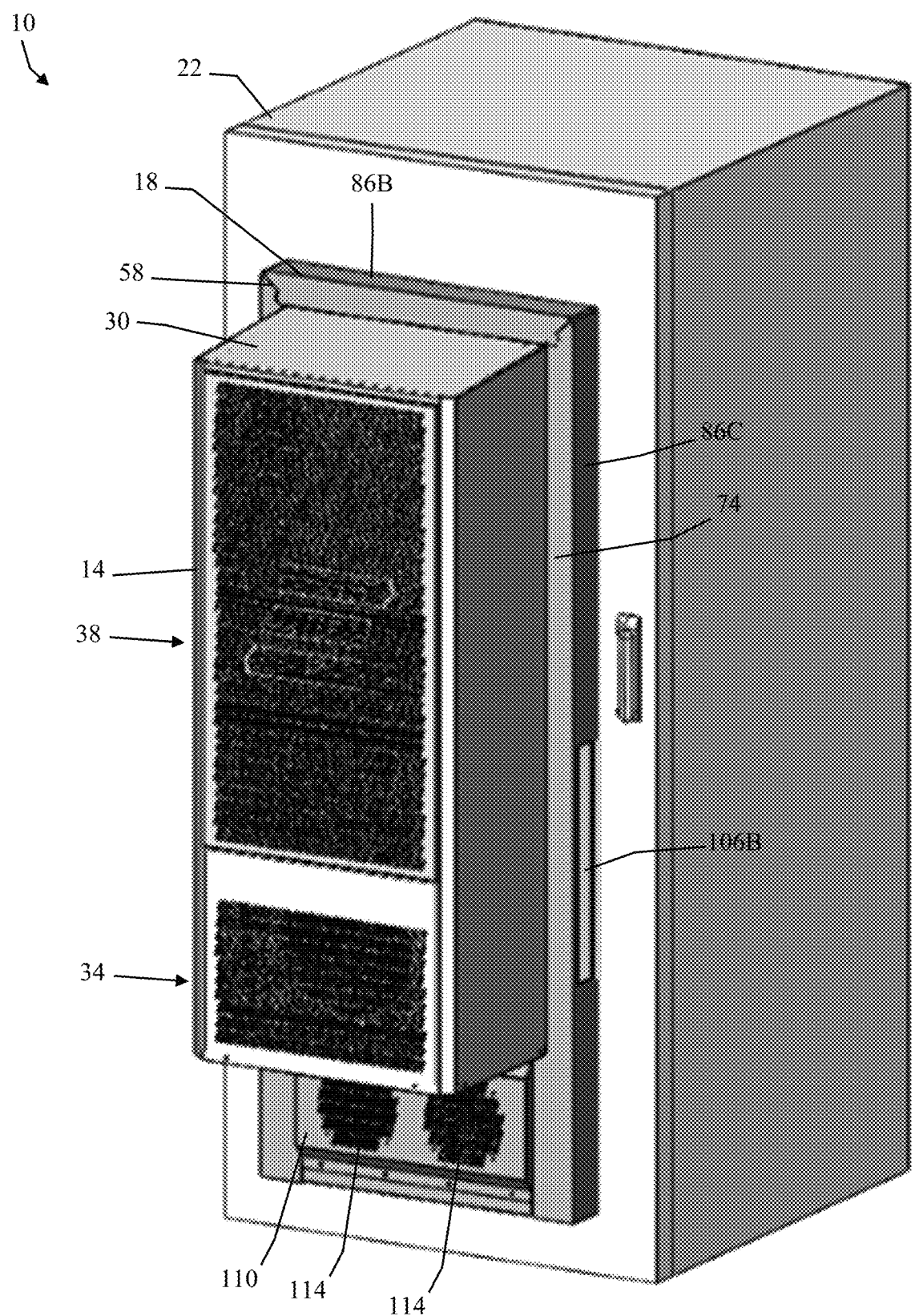
FIG. 1 is a perspective view of a heat exchanger assembly and an auxiliary air vent assembly coupled to an enclosure.

Unless otherwise defined, all technical and scientific terms used herein have the same meaning as commonly understood by one of ordinary skill in the art. The meaning and scope of the terms should be clear; in the event, however of any latent ambiguity, definitions provided herein take precedent over any dictionary or extrinsic definition.

Preferred methods and materials are described below, although methods and materials similar or equivalent to those described herein can be used in practice or testing of the present disclosure. All publications, patent applications, patents and other references mentioned herein are incorporated by reference in their entirety. The materials, methods, and examples disclosed herein are illustrative only and not intended to be limiting.

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "and" and "the" include plural references unless the context clearly dictates otherwise. Unless otherwise required by context, singular terms shall include pluralities and plural terms shall include the singular. The present disclosure also contemplates other embodiments "comprising," "consisting of" and "consisting essentially of," the embodiments or elements presented herein, whether explicitly set forth or not.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

"About" and "approximately" are used to provide flexibility to a numerical range endpoint by providing that a given value may be "slightly above" or "slightly below" the endpoint without affecting the desired result.

In the foregoing description of preferred embodiments, specific terminology has been resorted to for the sake of clarity. However, the invention is not intended to be limited to the specific terms so selected, and it is to be understood that each specific term includes all technical equivalents which operate in a similar manner to accomplish a similar technical purpose. Terms such as "top" and "bottom", "front" and "rear", "inner" and "outer", "above", "below", "upper", "lower", "vertical", "horizontal", "upright" and the like are used as words of convenience to provide reference points.

Conventional electronic enclosures have a single climate control unit (CCU) mounted to the door or the wall side of the enclosure. However, this conventional design creates a single point of failure such that when failure of the CCU occurs, heat is trapped inside the enclosure resulting in a rise in temperature and possible shut down or damage to the equipment. Conventional approaches to remedying the single point of failure to is add a secondary CCU or emergency vent fan on the opposite wall of the enclosure for redundancy. However, installing a secondary CCU or emergency vent on the opposite wall of the enclosure is not always possible due to interference with the equipment contained within the enclosure. Furthermore, conventional approaches to retrofit an existing installation to add a secondary CCU or emergency vent fan is costly because of the time and tools necessary to add an additional cutout to the enclosure.

With reference to FIG. 1, a climate control system 10 includes a heat exchanger assembly 14 and an auxiliary air vent assembly 18 (e.g., a mount) coupled to an enclosure 22 (e.g., an enclosure-of-interest, a computer and electronic equipment enclosure, a commercial or residential building). In the illustrated embodiment, the auxiliary air vent assembly 18 is positioned between the heat exchanger assembly 14 and the enclosure 22. In other words, the heat exchanger assembly 14 abuts (e.g., directly contacts) the auxiliary air vent assembly 18 and the auxiliary air vent assembly 18 abuts the enclosure 22. The auxiliary air vent assembly 18 mounts in between the heat exchanger assembly 14 and the enclosure 22. In the illustrated embodiment, the auxiliary air vent assembly 18 is coupled to the enclosure 22 and the heat exchanger assembly 14. In other words, the auxiliary air vent assembly 18 (e.g., the mount) is configured to couple the heat exchanger assembly 14 to the enclosure 22. As described herein, embodiments of the heat exchanger assembly 14, the auxiliary air vent assembly 18, and systems of the present disclosure can be mounted to the enclosure 22 to reduce heat load generated within the enclosure 22 (e.g., heat load generated by computer or electrical equipment) while providing back-up cooling redundancy.

Figure 2:
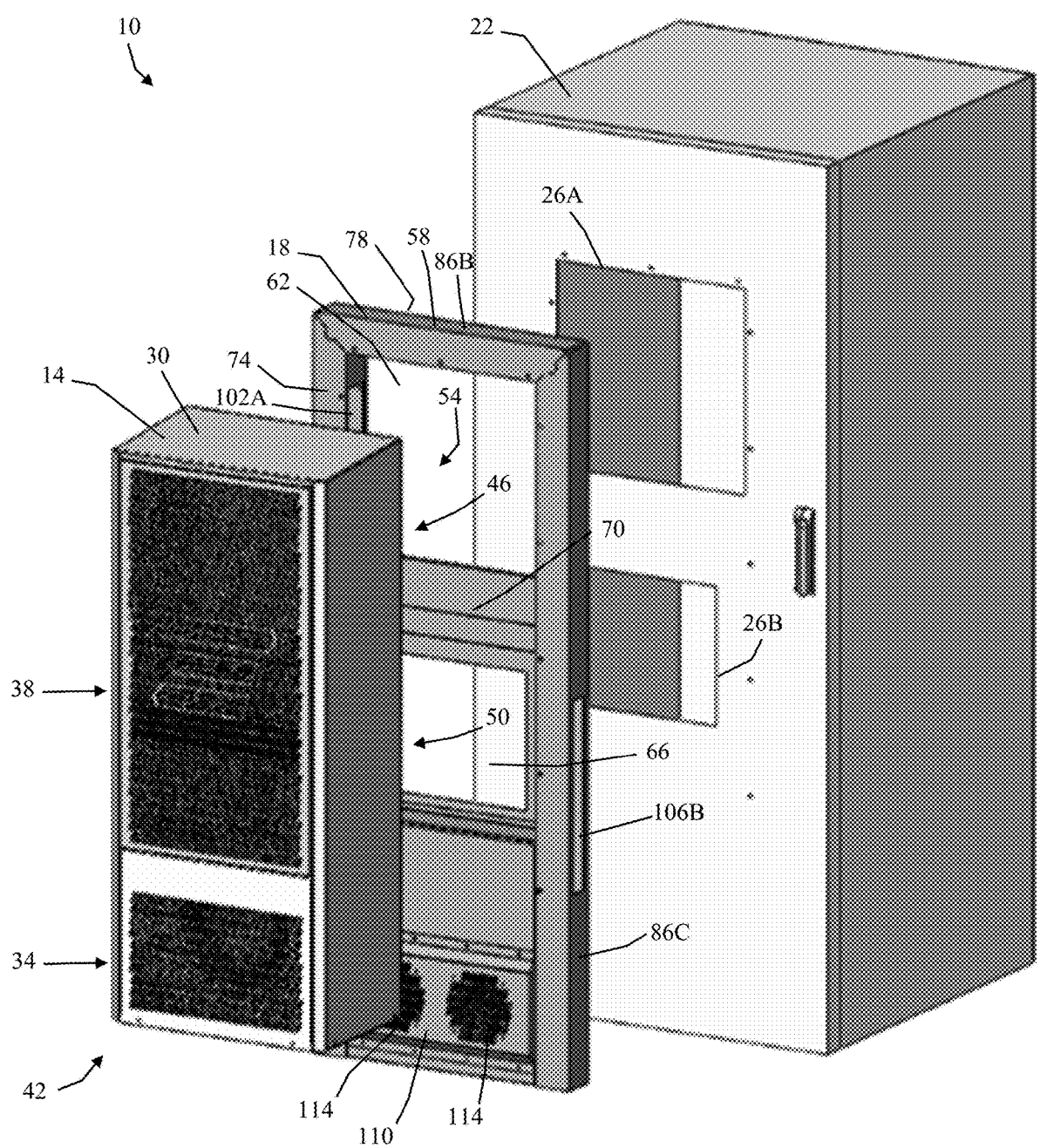
FIG. 2 is an exploded view of FIG. 1.

With reference to FIG. 2, the enclosure 22 includes cutouts 26A, 26B to place the heat exchanger assembly 14 in fluid communication (e.g., configured for the flow of a fluid) with the enclosure 22. Advantageously, the auxiliary air vent assembly 18 also utilizes the same cutouts 26A, 26B formed in the enclosure 22 to place the auxiliary air vent assembly 18 in fluid communication with the enclosure 22. In other words, the auxiliary air vent assembly 18 does not require additional cutouts to be formed in the enclosure 22 beyond those cutouts already being utilized by the heat exchanger assembly 14 (e.g., cutouts 26A, 26B). As such, an existing enclosure with a heat exchanger assembly coupled thereto can be easily retrofitted by positioning and mounting the auxiliary air vent assembly between the heat exchanger assembly and the enclosure—without the need for creating additional cutouts in the enclosure.

With continued reference to FIGS. 1-2, the heat exchanger assembly 14 includes a housing 30 with an external air inlet 34 and an external air outlet 38 on a first side 42, and an internal air inlet 46, and an internal air outlet 50 on a second side 54, opposite the first side 42. In some embodiments, the air inlets 34, 46 and the air outlets 38, 50 are covered with a grate or mesh material. In some embodiments, the heat exchanger assembly 14 includes a passive heat exchanger positioned within the housing 30. In some embodiments, the heat exchanger assembly 14 includes a first fan positioned at the internal air inlet 46 configured to create an internal airflow through the housing 30 from the internal air inlet 46 to the internal air outlet 50; and a second fan positioned at the external air inlet 34 configured to create an external airflow through the housing 30 from the external air inlet 34 to the external air outlet 38. In some embodiments, the external airflow is isolated from the internal airflow by a dividing wall positioned within the housing. In some embodiments, the dividing wall facilitates the separation of an external airflow path from an internal airflow path to prevent contamination of the internal environment of the enclosure with dust, debris, dirt, salt, precipitation, and the like, from the environment outside of the enclosure. Examples of such heat exchanger assemblies are described in U.S. patent application Ser. No. 17/434,120, filed Aug. 26, 2021, which is incorporated herein in its entirety. In other embodiments, the heat exchanger assembly 14 includes an air conditioner (e.g., an active cooling assembly, active cooling CCU).

Figure 3:
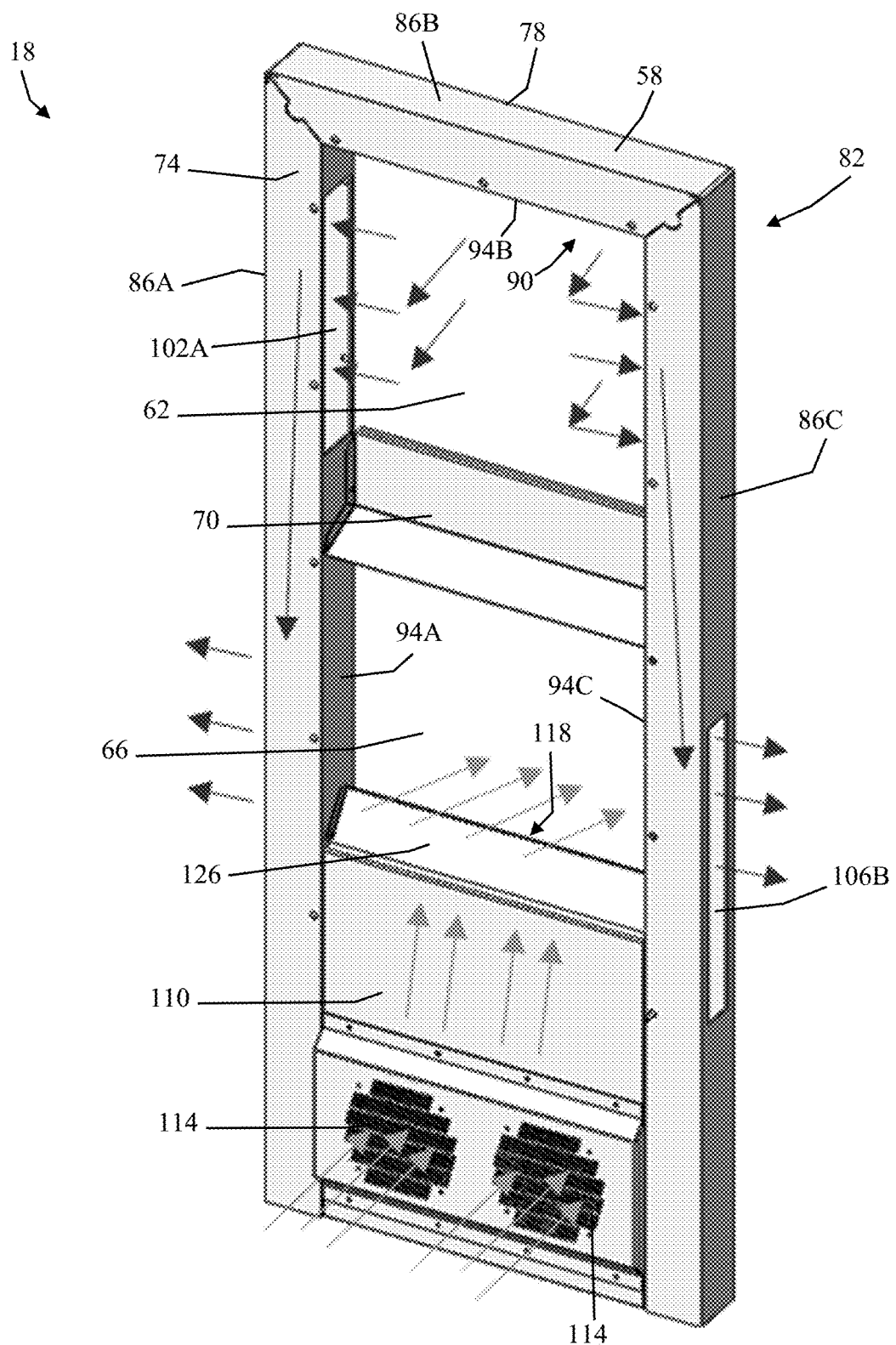
FIG. 3 is a perspective view of the auxiliary air vent assembly of FIG. 1, illustrating a flow of warm air and a flow of cool air.
Figure 4:
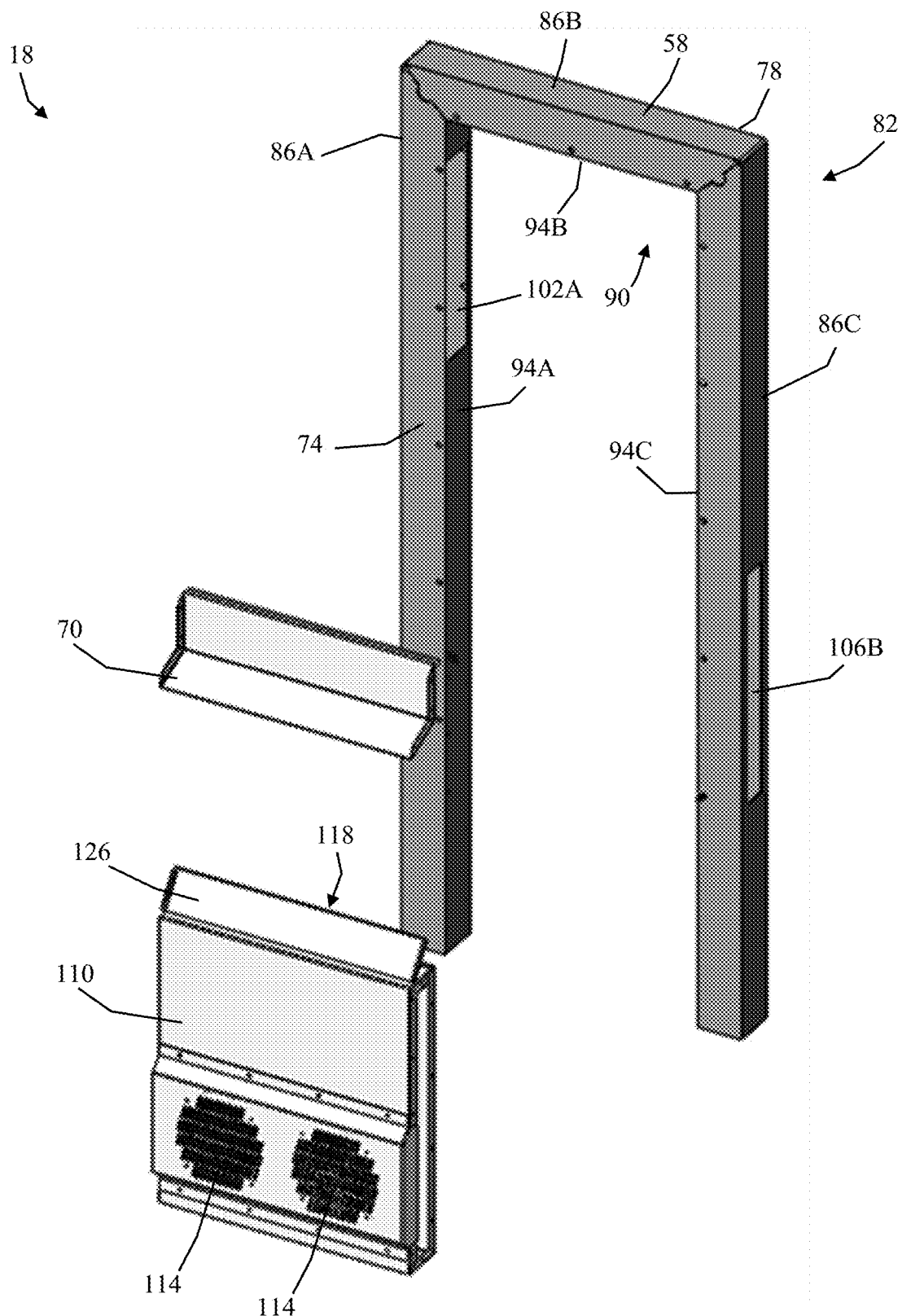
FIG. 4 is an exploded view of the auxiliary air vent assembly of FIG. 3.
Figure 5:
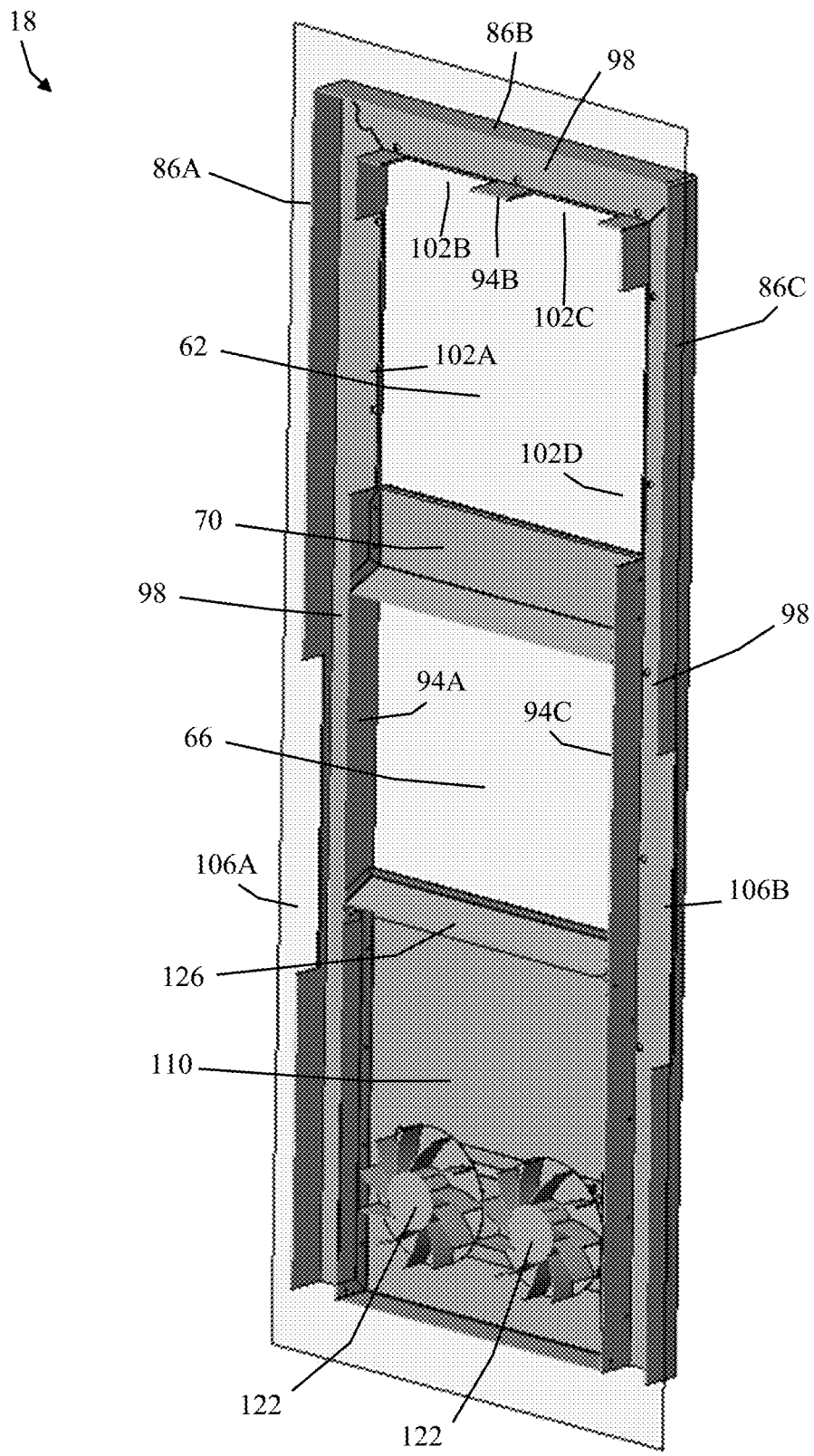
FIG. 5 is a perspective cross-sectional view of the auxiliary air vent assembly of FIG. 3.

With reference to FIGS. 3-5, the auxiliary air vent assembly 18 (e.g., the mount) includes a rim 58 made of square tubing (e.g., a square tube rim). The rim 58 at least partially defines an internal air inlet region 62 (corresponding to the internal air inlet 46) and an internal air outlet region 66 (corresponding to the internal air outlet 50). In the illustrated embodiment, the rim 58 defines at least a portion of the perimeter of the internal air inlet region 62 and the internal air outlet region 66. In some embodiments, a divider 70 is coupled to the rim 58 and is positioned between the internal air inlet region 62 and the internal air outlet region 66.

With reference to FIG. 2, the internal air inlet 46 of the heat exchanger assembly 14 is in fluid communication with the internal air inlet region 62. In the illustrated embodiment, the internal air inlet region 62 is positioned between the internal air inlet 46 and the enclosure 22. Likewise, the internal air outlet 50 of the heat exchanger assembly 14 is in fluid communication with the internal air outlet region 66. In the illustrated embodiment, the internal air outlet region 66 is positioned between the internal air outlet 50 and the enclosure 22. In the illustrated embodiment, the rim 58 at least partially surrounds the internal air inlet 46 and the internal air outlet 50 of the housing 30. In other words, the internal air inlet 46 and the internal air outlet 50 of the heat exchanger assembly 14 are positioned within (e.g., partially enclosed by) the rim 58. In some embodiments, the rim 58 extends out beyond the housing 30 when mounted on the enclosure 22.

With continued reference to FIG. 2, the rim 58 includes a first mount surface 74 and a second mount surface 78, opposite the first mount surface 74. In some embodiments, the mount surfaces 74, 78 are planar parallel surfaces. In the illustrated embodiment, the heat exchanger assembly 14 abuts (e.g., directly contacts) the first mount surface 74. In the illustrated embodiment, the second mount surface 78 abuts (e.g., directly contacts) the enclosure 22.

With continued reference to FIGS. 4 and 5, the rim 58 includes an outer portion 82 (e.g., outward facing surfaces 86A, 86B, 86C) extending between the first mount surface 74 and the second mount surface 78, and an inner portion 90 (e.g., inward facing surfaces 94A, 94B, 94C) extending between the first mount surface 74 and the second mount surface 78. In the illustrated embodiment, the outer portion 82 includes three outward facing surfaces 86A, 86B, 86C and the inner portion 90 includes three inward facing surfaces 94A, 94B, 94C. In other embodiments, the outer and inner portions 82, 90 include any number of outward or inward facing surfaces.

With reference to FIG. 5, the rim 58 includes a passageway 98 (e.g., an air passageway). In the illustrated embodiment, the rim 58 is a hollow square tube (square tubing) that defines the internal air passageway 98 along the entire length of the rim 58. In the illustrated embodiment, the air passageway 98 is "U"-shaped.

With continued reference to FIG. 5, apertures 102A-102D and 106A-106B are formed in the rim 58. As described in further detail herein, in some embodiments, the apertures are laser cut into the square tube, exposing the internal air passageway. The rim 58 includes the apertures 102A-102D (e.g., the inward facing apertures) formed on the inner portion 90 of the rim 58 and the apertures 106A-106B (e.g., the outward facing apertures) formed on the outer portion 82 of the rim 58. In the illustrated embodiment, the apertures 102A-102D and 106A-106B connect to the air passageway 98. The apertures 102A-102D are in fluid communication with the internal air inlet region 62 and the air passageway 98. The apertures 106A-106B are in fluid communication with the air passageway 98 and ambient atmosphere (e.g., the environment). As such, the air passageway 98 extends between the inward facing apertures 102A-102D and the outward facing apertures 106A-106B. For example, the aperture 102A is in fluid communication with the internal air inlet region 62, the aperture 106A is in fluid communication with ambient atmosphere, and the air passageway 98 extends between the first aperture 102A and the second aperture 106A.

Figure 8A:
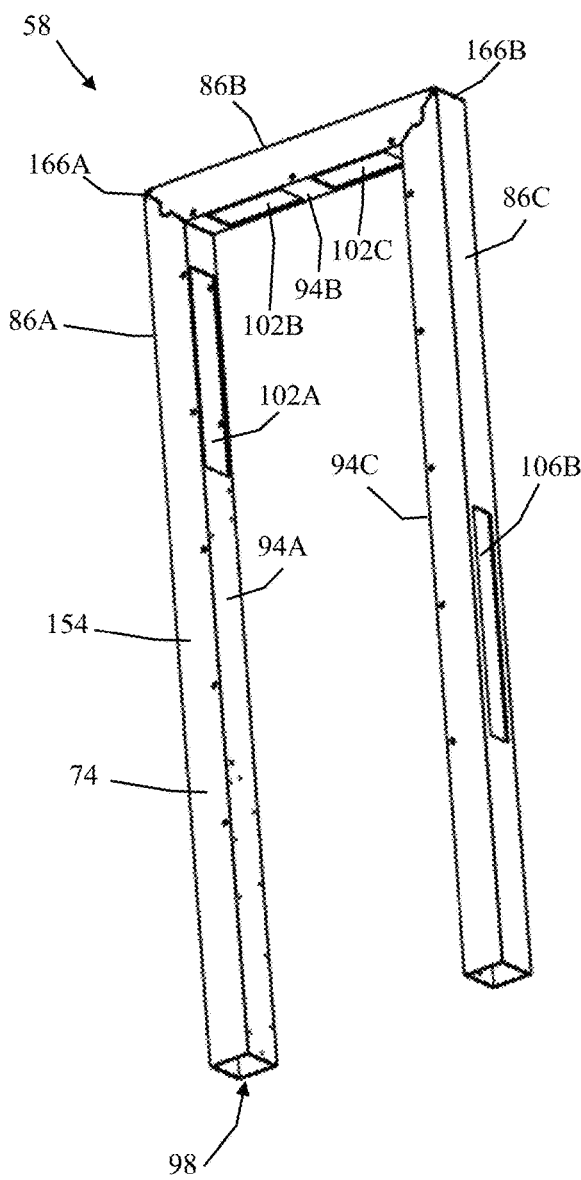
FIG. 8A is a perspective view of the rim of the auxiliary air vent assembly in a bent configuration.
Figure 8B:
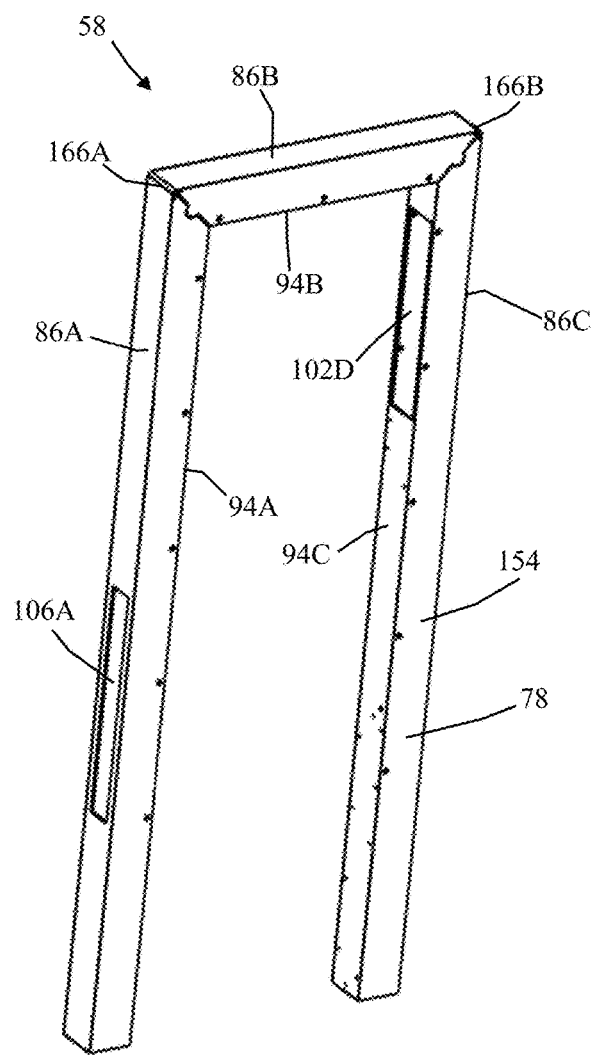
FIG. 8B is another perspective view of the rim of FIG. 8A.

In some embodiments, the outward facing apertures 106A-106B are positioned vertically lower than the inward facing apertures 102A-102D. In other words, as viewed from the frame of reference of FIG. 3, the apertures 102A-102D are positioned above the apertures 106A-106B. In the illustrated embodiment, the divider 70 is positioned between (e.g., positioned vertically between) the inward facing apertures 102A-102D and the outward facing apertures 106A-106B. In the illustrated embodiment, there are two outward facing apertures: the aperture 106A formed on the outward surface 86A (FIG. 8B) and the aperture 106B formed on the outward surface 86C (FIG. 8A). In the illustrated embodiment, there are four inward facing apertures: the aperture 102A formed on the inward surface 94A (FIG. 8A), the apertures 102B, 102C formed on the inward surface 94B (FIG. 8A), and the aperture 106D formed on the inward surface 94C (FIG. 8B). In other embodiments, the rim 58 includes at least one inward facing aperture and at least one outward facing aperture.

With reference to FIG. 4, the auxiliary air vent assembly 18 further includes a fan housing 110 coupled to the rim 58. In the illustrated embodiment, the fan housing 110 is coupled to between the inward facing surfaces 94A, 94C. The fan housing 110 includes a fan inlet 114, a fan outlet 118, and a fan (or fans) 122 is positioned within the fan housing 110. The fan outlet 118 is in fluid communication with the internal air outlet region 66 of the auxiliary air vent assembly 18.

Figure 6:
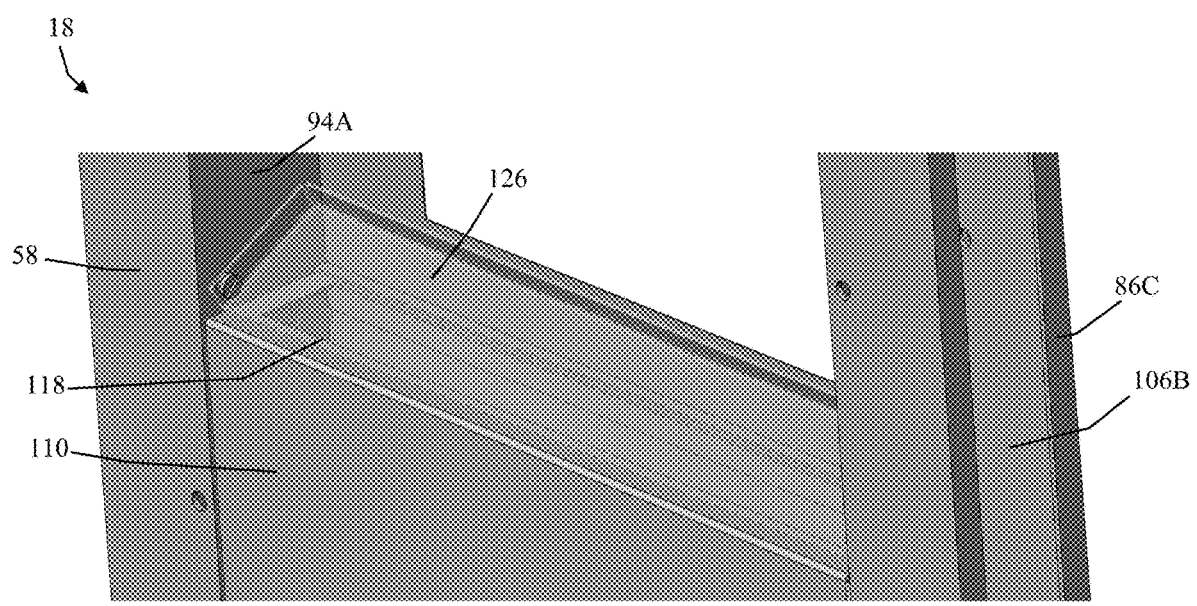
FIG. 6 is a partial perspective view of a damper of the auxiliary air vent assembly of FIG. 3.

With reference to FIG. 6, a damper 126 is positioned at the fan outlet 118. In some embodiments, the damper 126 is pivotably coupled to the rim 58 or the fan housing 110 and is configured to pivot open in response to pressure generated in the fan housing 110 by the fans 122. For example, when the fans 122 are deenergized, the damper 126 is in a closed position and closes (e.g., blocks) the fan outlet 118. When the fans 122 are energized, pressure builds up in the fan housing 110 and causes the damper 126 to pivot to an open position, where the fan outlet 118 is opened and placed in fluid communication with the internal air outlet region 66 (and the enclosure 22). In other embodiments, the damper 126 is positioned relative to the fan outlet 118 and then fixed relative to the fan housing 110 or rim 58 via a fastener or weld.

With reference to FIG. 1, with the heat exchanger assembly 14 coupled to the auxiliary air vent assembly 18, the external air inlet 34 is positioned between (e.g., vertically between) the external air outlet 38 and the fan inlet 114 (as viewed from the frame of reference of FIG. 1). In other words, the fan inlet 114 is positioned below the external air inlet 34. In the illustrated embodiment, the fan inlet 114 and the first mount surface 74 of the rim 58 are co-planar. As such, the fan inlet 114 is oriented in the same direction as the external air inlet 34 and the external air outlet 38 of the heat exchanger assembly 14.

In operation, with reference to FIGS. 2 and 3, the auxiliary air vent assembly 18 provides an auxiliary (e.g., back-up or redundant) means for cooling the enclosure 22. For example, when or if the heat exchanger assembly 14 is faulty, not operating, not operating properly, or not operating efficiently; the auxiliary air vent assembly 18 permits hot air to escape the enclosure 22 and replaces the hot air with cooler ambient air. In the illustrated embodiment, warm air from the enclosure 22 travels through the cutout 26A into the internal air inlet region 62. Instead of passing through the heat exchanger assembly 14, the warm air (illustrated with red arrows in FIG. 3) in the internal air inlet region 62 travels through the inward facing apertures 102A-102D, through the passageway 98, and exhausts out the outward facing apertures 106A-106B. In other words, the warm air from the enclosure 22 vents through the passageway 98 and out the apertures 106A-106B. At the same time, the fans 122 draw cooler ambient air in from the fan inlet 114 and pressurize the fan housing 110. The cool ambient air in the fan housing 110 travels through the fan outlet 118 and pass the damper 126 into the internal air outlet region 66 (illustrated with blue arrows in FIG. 3). The cool air in the internal air outlet region 66 then enters the enclosure 22 via the cutout 26B.

As described herein, the auxiliary air vent assembly 18 has the several advantages. First, the auxiliary air vent assembly 18 provides back-up cooling capability for the enclosure 22 if the heat exchanger assembly 14 fails or otherwise becomes ineffective. Second, there is a reduced cost of installation because there are no cutout changes in the enclosure 22 required for mounting the auxiliary air vent assembly 18. Third, there is no interference with the electrical equipment contained within the enclosure 22 during or after installation of the auxiliary air vent assembly 18. In other words, the auxiliary air vent assembly 18 is mounted on an external surface of the enclosure 22 and does not extend into the enclosure 22.

Figure 9:
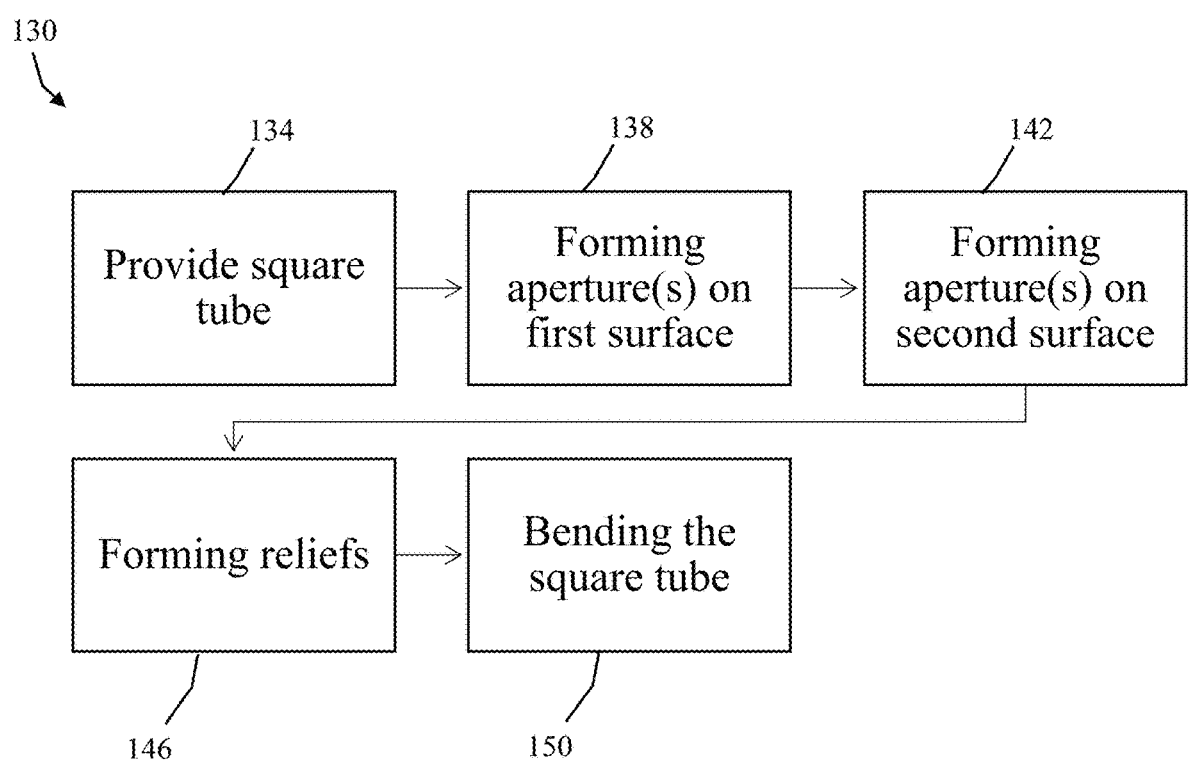
FIG. 9 is a method of manufacturing the auxiliary air vent assembly of FIG. 3.

Embodiments of the present disclosure also include methods of manufacturing a mount (e.g., the auxiliary air vent assembly 18 or portions thereof) for coupling a heat exchanger assembly (e.g., the heat exchanger assembly 14) to an enclosure (e.g., the enclosure 22). With reference to FIG. 9, a method 130 of manufacturing a mount for a heat exchanger assembly is illustrated. The rim 58 of the auxiliary air vent assembly 18 is a laser cut and welded square tube design, whereas conventional vent solutions are typically fabricated with sheet metal. As described herein, the rim 58 is a single square tube that has apertures (e.g., the apertures 102A-102D, 106A-106B) laser cut therein (FIGS. 7A and 7B) and then the rim 58 is formed (bent) into a "U" shape (FIGS. 8A and 8B). Advantageously, the method 130 simplifies fabrication and minimizes the number of components required for the auxiliary air vent assembly 18. In addition, the rim 58 advantageously has improved water tightness and sealing from the elements because the rim 58 is formed from a single square tube component.

Figure 7A:
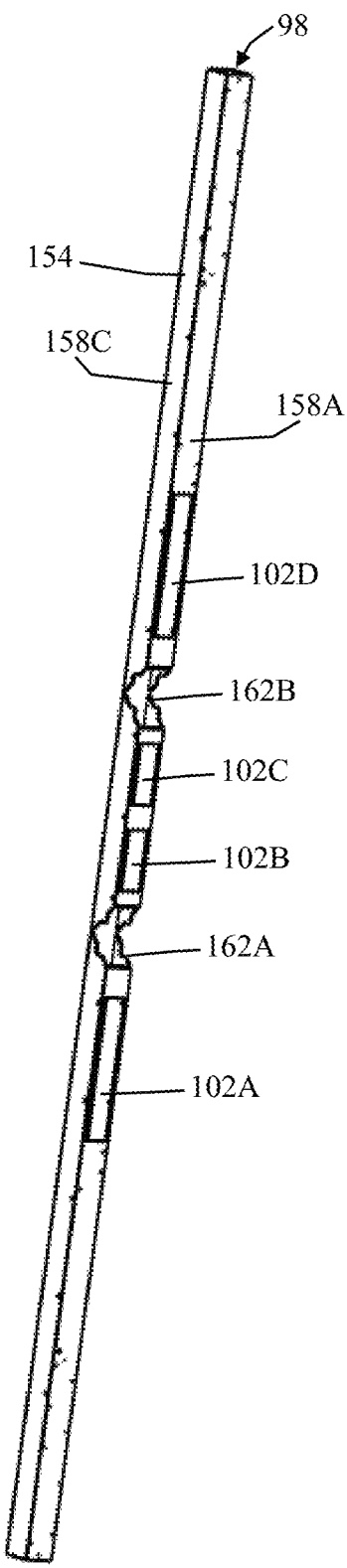
FIG. 7A is a perspective view of a rim of the auxiliary air vent assembly in a straight configuration.
Figure 7B:
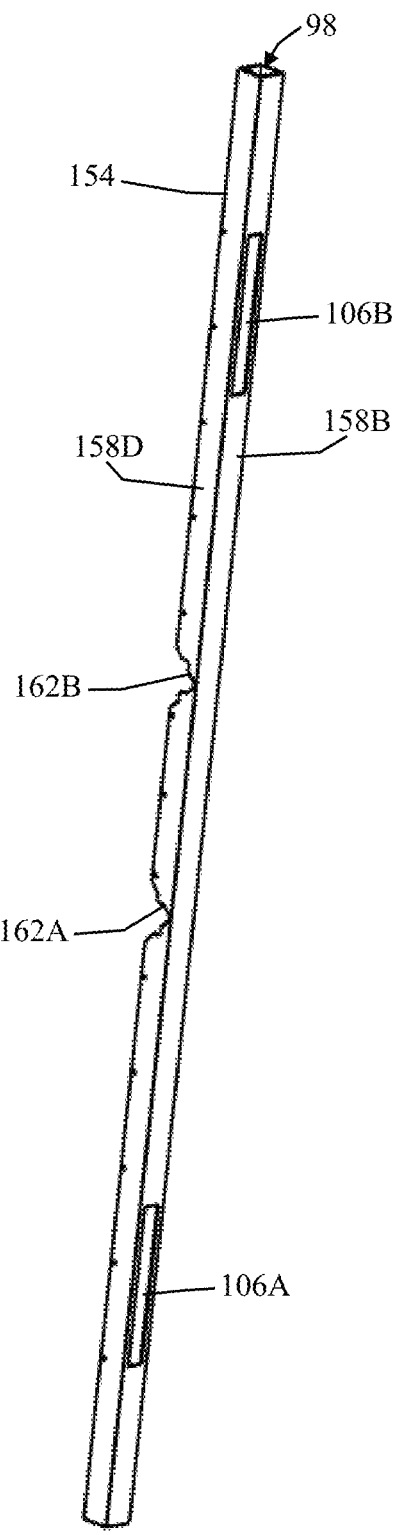
FIG. 7B is another perspective view of the rim of FIG. 7A.

The method 130 includes STEP 134 of providing a square tube 154 (e.g., a single straight square tube) with the internal passageway 98 defined therein. The square tube 154 includes four external surfaces 158A, 158B, 158C, 158D. With reference to FIGS. 7A and 7B, STEP 138 of the method 130 includes forming apertures (e.g., the inward facing apertures 102A-102D) in a first surface 158A of the square tube 154, and STEP 142 includes forming apertures (e.g., the outward facing apertures 106A-106B) in a second surface 158B of the square tube 154. In the illustrated embodiment, the second surface 158B is opposite the first surface 158A. The internal passageway 98 places the apertures 106A-106D on the first surface 158A and the apertures 102A-102B on the second surface 158B in fluid communication with each other.

The method 130 further includes STEP 146 of forming a first relief 162A and a second relief 162B in the square tube 154. In the illustrated embodiment, the first relief 162A and the second relief 162B are formed in the first surface 158A, the third surface 158C, and the fourth surface 158D. In the illustrated embodiment, the first relief 162A is positioned between the aperture 102A and the aperture 102B, and the second relief 162B is positioned between the aperture 102C and the aperture 102D (FIG. 7A). In some embodiments, forming of the apertures 102A-102D, 106A-106B and reliefs 162A, 162B of STEPS 138, 142, and 146 are performed with laser cutting.

With reference to FIGS. 8A and 8B, the method 130 further includes STEP 150 of bending the square tube 154 at the first relief 162A to form a first corner 166A and bending the square tube 154 at the second relief 162B to form a second corner 166B. In some embodiments, after bending, the square tube 154 is "U" or "C" shaped. The bending steps (e.g., STEP 150) transforms the first external surface 158A into the inner portion 90 with three inward facing surface 94A-94C and transforms the second external surface 158B into an outer portion 82 with three outward facing surface 86A-86C. In other words, in response to bending the square tube 154, the straight square tube becomes U-shaped, the first surface 158A becomes a plurality of inward facing surfaces 94A-94C, and the second surface 158B becomes a plurality of outward facing surfaces 86A-86C. As such, the method 130 transforms the square tube 154 into the rim 58.

In some embodiments, the method 130 further includes coupling a divider (e.g., the divider 70) to the first surface 158A the square tube 154 (e.g., the inner portion 90, the inward facing surface 94A-94C). In the illustrated embodiment, the divider 70 is coupled to the inward facing surface 94A and the inward facing surface 94C. In some embodiments, the method 130 further includes coupling a fan module (e.g., the fan housing 110, etc.) to the first surface 158A the square tube 154 (e.g., the inner portion 90, the inward facing surface 94A-94C). In some embodiments, coupling the divider and/or the fan module to the square tube 154 is done with welding (e.g., TIG welding, laser welding, etc.). In the illustrated embodiment, the method 130 is described as a series of sequential steps. In some embodiments, the order in which the steps are performed is modified or done simultaneously with another step.

It will be readily apparent to those skilled in the art that other suitable modifications. It is understood that the foregoing detailed description and accompanying examples are merely illustrative and are not to be taken as limitations upon the scope of the disclosure, which is defined solely by the appended claims and their equivalents. Various changes and modifications to the disclosed embodiments will be apparent to those skilled in the art. Such changes and modifications of the disclosure may be made without departing from the spirit and scope thereof.

What is claimed is:

1. A method of manufacturing a mount for a heat exchanger assembly, the method comprising:
    providing a square tube with an internal passageway;
    forming a first aperture in a first surface of the square tube;
    forming a second aperture in a second surface of the square tube, the second surface opposite the first surface;
    forming a first relief and a second relief in the square tube;
    bending the square tube at the first relief to form a first corner;
    bending the square tube at the second relief to form a second corner; and
    coupling a fan module to the first surface of the square tube;
    wherein the internal passageway places the first aperture and the second aperture in fluid communication.

2. The method of claim 1, wherein the square tube further includes a third surface and a fourth surface, and wherein the first relief and the second relief are formed in the first surface, the third surface, and the fourth surface.

3. The method of claim 1, wherein in response to bending the square tube, the square tube is U-shaped and the first surface is an interior surface.

4. The method claim 1, further comprising coupling a divider to the first surface of the square tube.

* * * * *